United States Patent
Pornin et al.

(10) Patent No.: US 8,680,664 B2
(45) Date of Patent: Mar. 25, 2014

(54) STRUCTURE FOR ENCAPSULATING AN ELECTRONIC DEVICE

(71) Applicant: Commissariat A L'Energie Atomique et Aux Energies Alternatives, Paris (FR)

(72) Inventors: Jean-Louis Pornin, Crolles (FR); Geoffroy Dumont, Paris (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/644,444

(22) Filed: Oct. 4, 2012

(65) Prior Publication Data

US 2013/0087933 A1    Apr. 11, 2013

(30) Foreign Application Priority Data

Oct. 11, 2011   (FR) ...................................... 11 59168

(51) Int. Cl.
*H01L 21/44*   (2006.01)

(52) U.S. Cl.
USPC ........... 257/682; 257/415; 257/723; 257/789; 257/E23.137

(58) Field of Classification Search
USPC ................. 257/100, 415–416, 682, 723, 789; 438/52–54
See application file for complete search history.

(56) References Cited

U.S. PATENT DOCUMENTS

| | | |
|---|---|---|
| 7,786,561 B2 | 8/2010 | Pornin et al. |
| 2004/0189195 A1 | 9/2004 | Allemand |
| 2004/0232337 A1 | 11/2004 | Vilain |
| 2006/0108675 A1 * | 5/2006 | Colgan et al. .................. 257/684 |
| 2008/0042561 A1 | 2/2008 | Allemand |
| 2008/0049386 A1 | 2/2008 | Pornin et al. |
| 2008/0179696 A1 * | 7/2008 | Chen et al. ..................... 257/415 |
| 2008/0213539 A1 | 9/2008 | Souriau et al. |
| 2010/0003789 A1 * | 1/2010 | Caplet et al. ................... 438/124 |
| 2010/0025832 A1 | 2/2010 | Atnip et al. |

(Continued)

FOREIGN PATENT DOCUMENTS

| | | |
|---|---|---|
| EP | 1 878 693 A1 | 1/2008 |
| EP | 2 141 117 A1 | 1/2010 |

(Continued)

OTHER PUBLICATIONS

U.S. Appl. No. 13/645,717, filed Oct. 5, 2012, Baillin et al.

(Continued)

*Primary Examiner* — Dung A. Le
(74) *Attorney, Agent, or Firm* — Oblon, Spivak, McClelland, Maier & Neustadt, L.L.P.

(57) ABSTRACT

A structure for encapsulating at least one electronic device, including at least one first cavity bounded by a support and at least one cap provided on the support and wherein the electronic device is encapsulated, at least one aperture passing through the cap and communicating the inside of the first cavity with at least one portion of getter material provided in at least one second cavity which is arranged on the support and adjacent to the first cavity, at least one part of said portion of getter material being provided on the support or against at least one outer side wall of the first cavity, the first cavity and the second cavity forming together a hermetically sealed volume.

9 Claims, 4 Drawing Sheets

(56) References Cited

U.S. PATENT DOCUMENTS

| | | |
|---|---|---|
| 2010/0025845 A1 | 2/2010 | Merz et al. |
| 2010/0178419 A1 | 7/2010 | Baillin |
| 2010/0193215 A1 | 8/2010 | Baillin |
| 2011/0079425 A1 | 4/2011 | Baillin et al. |
| 2011/0284916 A1 | 11/2011 | Allemand |
| 2011/0285004 A1 | 11/2011 | Allemand |
| 2012/0112293 A1 | 5/2012 | Pornin et al. |

FOREIGN PATENT DOCUMENTS

| | | |
|---|---|---|
| EP | 2 308 798 A1 | 4/2011 |
| FR | 2 826 725 A1 | 1/2003 |
| FR | 2 883 099 A1 | 9/2006 |
| FR | 2 922 202 A1 | 4/2009 |
| WO | WO 2007/113325 A1 | 10/2007 |
| WO | WO 2007/113325 A8 | 10/2007 |
| WO | WO 2011/003908 A1 | 1/2011 |

OTHER PUBLICATIONS

French Preliminary Search Report Issued Apr. 30, 2012 in Patent Application No. 1159168 (with English translation).

\* cited by examiner

STRUCTURE FOR ENCAPSULATING AN ELECTRONIC DEVICE

DESCRIPTION

1. Technical Field

The invention relates to a structure for encapsulating at least one electronic device, for example of the MEMS (microelectromechanical system), NEMS (nano-electromechanical system) or even MOEMS (micro-opto-electromechanical system) type, encapsulated in a first cavity and which includes a getter material provided in a second cavity adjacent to and communicating with the first cavity, as well as a method for making such an encapsulating structure.

The invention is advantageously implemented to ensure the individual hermetic encapsulation, that is fluid and/or gas tightness, for example under vacuum, of several micro-electronic devices assembled as an array on a support (for example a substrate) and for which it is attempted to maximize areas dedicated to the devices in order to optimize performances of the devices. In this packaging type, microelectronic devices are individually encapsulated in first cavities separated from each other by spaces used as second cavities wherein portions of getter material are provided. This invention thus allows these lost spaces between the first cavities wherein the micro-electronic devices are encapsulated to be used.

2. State of Prior Art

It is known to encapsulate a micro-electronic device, for example a sensor, by implementing a TLP (Thin Layer Packaging) type method, providing the device with good pressure conditions in order to operate. This method uses to a sacrificial layer, for example comprising a resin, which is deposited onto the device and then etched according to the desired cavity shape. The cap is then made by depositing a thin layer, for example comprising $SiO_2$, onto the sacrificial layer. Finally, the sacrificial layer is removed through one or more release holes formed through the cap. These holes are then plugged to ensure the tightness of the cavity thus made.

When the device is an optical device for emitting and/or receiving light, for example a micro-bolometer type detector, it is sometimes necessary for it to be provided in a vacuum atmosphere (for example under high vacuum or low vacuum, that is the pressure of which is between about $10^{-3}$ mbar and $10^{-7}$ mbar). Such a vacuum is generally achieved by introducing into the cavity a getter effect material, that is a material capable of performing a gas absorption and/or adsorption in the cavity. Besides, it is also necessary, when the micro-electronic device is intended for emitting and/or receiving light, not to introduce anything which would be opaque to the wavelength(s) intended to be emitted and/or received by the device, on the light path of the device.

To this end, document FR 2 826 725 proposes to provide the getter effect material under the micro-electronic device or on the inner walls of the cavity.

This solution however has the drawback that the getter material is in contact with materials of the device during technological steps for making the device, which may result in degrading or even cancelling the expected getter effect.

A second solution consists in depositing the getter material into the cavity, onto the substrate and near to the micro-electronic device. This second solution however has the drawback to reduce the substrate area dedicated to the micro-electronic device, which results either in decreased performances of the device (at a constant substrate occupancy area), or an increased device size (and thus an increased device cost because fewer micro-electronic devices are made on the semi-conductor wafer used as a substrate).

DESCRIPTION OF THE INVENTION

Thus there is a need to provide a new structure for encapsulating at least one electronic device enabling gas absorption and/or adsorption properties of the getter material to be preserved, which allows to make the getter material outside the optical field when the electronic device is intended for emitting and/or receiving light, while maximizing the area dedicated to the electronic device on the support.

To this end, one embodiment of the present invention provides a structure for encapsulating at least one electronic device, including at least one first cavity bounded by a support and at least one cap provided on the support and wherein the electronic device is encapsulated, at least one aperture passing through the cap and communicating the inside of the first cavity with at least one portion of getter material provided in at least one second cavity adjacent to the first cavity, at least one part of said portion of getter material being provided on the support and/or against at least one outer side wall of the first cavity, the first cavity and the second cavity forming together a hermetically sealed volume or space.

Because the getter material is deposited into a second cavity, outside the inner volume of the first cavity corresponding to the space between the cap and the support wherein the electronic device is provided, it does not undergo a degradation relating to the implementation of technological steps for making the electronic device and the first cavity, because the getter material can be deposited after making the electronic device and the first cavity wherein is encapsulated the electronic device.

Moreover, given that the getter material lies outside the first cavity, on a surface of the support for example dedicated to the separation of electronic devices, the surface of the support inside the first cavity is wholly dedicated to the electronic device and is not reduced by the presence of the getter material.

The surface of getter material which is used is neither limited by the volume of the first cavity, thereby significantly increasing the area of getter material for making an absorption and/or adsorption of gases being present in the first cavity, improving for example the vacuum level that can exist in the first cavity, which could vary from the closing pressure which may be in the order of one millibar, to a pressure in the order of about $10^{-3}$ mbar generally corresponding to the operating point of the device, for example of the MEMS type, as well as the lifetime of the electronic device, after the getter is activated.

Because the first cavity and the second cavity form a hermetically sealed volume, or space, the getter material provided in the second cavity allows ensuring that the operating pressure of the electronic device which may be individually encapsulated in the first cavity is maintained. Such an individual encapsulation prevents a sealing leak upon encapsulating one of the devices from making other devices made on the same support and which would be collectively encapsulated unusable, such as for example in the case of an array of sensors.

Thanks to this encapsulating structure, it is for example possible to use free spaces present between different first cavities wherein several electronic devices are individually encapsulated to deposit the getter material therein, and this without altering support zones dedicated to the electronic devices and without having to communicate different cavities, these free spaces forming the second cavities which are adjacent to the first cavities.

When the getter material is formed as the second cavity is being closed, it is neither degraded nor contaminated, and the closing pressure can be lower because of the presence of the getter effect at the time of this closure.

Finally, the shape and the dimensions of the cap may be fitted to the shape of the electronic device to optimize the area dedicated to the getter material.

The second cavity or cavities may be made on the support, especially next to the first cavity or cavities. Thus the available space on the support is optimized in order to form the first and second cavities without increasing the global thickness of the encapsulation structure.

The getter material may be deposited against one or more outer side walls of the first cavity, thus increasing the area of the getter material deposited.

The inside of the first cavity communicates with the inside of the second cavity, that is with the portion of getter material, via the aperture. Gases present in the first cavity can contact the portion of getter material by passing through the aperture.

The term "electronic device" herein means any type of device, preferentially having micrometer dimensions such as for example MEMS or MOEMS type devices, but also electronic devices having nanometer dimensions such as NEMS or even electronic and/or electric devices having greater dimensions.

The volume, or space, formed by the first cavity and the second cavity may be hermetically sealed by the portion of getter material. In one alternative, it is possible that a material other than the getter material is used as a plug to hermetically seal this volume.

The aperture may pass through a surface of the cap which is substantially perpendicular to a main plane of the support. Such a main plane may correspond to the support face on which the electronic device is made.

The inside of the first cavity may communicate with the portion of getter material via at least one channel forming space between the first cavity and the second cavity, wherein the aperture may be such that it opens into the channel. In this case, the first cavity and the second cavity may communicate together at least via the aperture and the channel.

Such a channel, upon closing the volume formed by the first cavity and the second cavity by the getter material or another plugging material, can prevent the plugging material(s) from penetrating inside the first cavity and being deposited onto the electronic device.

At least one second part of the portion of getter material may plug at least one second aperture giving access to the channel or to the first aperture.

This second aperture may be made through a portion of material bounding, with the cap, the channel.

The second part of the portion of getter material may be covered with a sealing layer.

The encapsulating structure may include a plurality of electronic devices encapsulated in first distinct cavities bounded by the support and caps provided on the support, openings passing through the caps and communicating the inside of the first cavities with one or more portions of getter material provided in one or more second cavities juxtaposed and/or formed between the first cavities, at least one part of said portion(s) of getter material being provided on the support and/or against one or more outer side walls of the first cavities.

Thus, the encapsulating structure can form an array structure of electronic devices having hermetic cavities including on a support:
  a set of electronic devices with hermetic cavities including at least one free aperture respectively,
  at least one getter material provided in the side spaces between the first cavities, these side spaces forming the second cavities,
  a closing layer provided on the cavities such that each first cavity is tight independently from the other first cavities while keeping in communication with the getter provided in spaces between the first cavities.

The insides of several first cavities may communicate together via the apertures passing through the caps of said first cavities.

The encapsulating structure may further include a layer of getter material hermetically sealing the volume(s), or space(s), formed by the first cavities and the second cavity or cavities.

Another embodiment of the invention relates to a method for making a structure for encapsulating at least one electronic device, including at least the steps of:
  making the electronic device on a support,
  making at least one cap on the support, forming a first cavity bounded by the support and the cap and wherein the electronic device is encapsulated;
  making at least one aperture through the cap,
  depositing at least one portion of getter material in at least one second cavity adjacent to the first cavity, the aperture communicating the inside of the first cavity with the portion of getter material, at least one part of said portion of getter material being provided on the support and/or against at least one outer side wall of the first cavity, the first cavity and the second cavity forming together a hermetically sealed volume or space.

The portion of getter material may be deposited such that it hermetically seals the volume, or space, formed by the first cavity and the second cavity.

The method may further include, between making the aperture through the cap and depositing the portion of getter material, making at least one channel forming space between the first cavity and the second cavity and for communicating the inside of the first cavity with the portion of getter material, the aperture being such that it opens into the channel.

Depositing the portion of getter material may be made such that at least one second part of the portion of getter material plugs at least one second aperture giving access to the channel or to the first aperture, and hermetically sealing the volume or space formed by the first cavity and the second cavity.

The method may further include, after depositing the portion of getter material, a step of depositing a sealing layer covering the second part of the portion of getter material.

The method may include making a plurality of electronic devices and a plurality of caps on the support, encapsulating the electronic devices in first distinct cavities bounded by the support and the caps, the method further including making a plurality of apertures through the caps and depositing one or more portions of getter material into one or more second cavities formed between the first cavities, the apertures communicating the inside of the first cavities with the portion(s) of getter material, at least one part of said portion(s) of getter material being provided on the support and/or against one or more outer side walls of the first cavities.

The apertures may be made such that the inside of several first cavities communicates via the apertures passing through the caps of said first cavities.

The method may further include making a layer of getter material hermetically sealing the volume(s) or space(s) formed by the first cavities and the second cavity or cavities.

BRIEF DESCRIPTION OF THE DRAWINGS

The present invention will be better understood upon reading the description of exemplary embodiments given by way of illustration only and in no way limiting in reference to the appended drawings wherein.

Identical, similar or equivalent parts from different figures described hereinafter have the same reference numerals so as to facilitate switching from one figure to another.

Different parts represented in the figures are not necessarily drawn to a uniform scale, to make the figures clearer.

Different possibilities (alternatives and embodiments) should be understood as being not exclusive from each other and can be combined between each other.

DETAILED DISCLOSURE OF PARTICULAR EMBODIMENTS

Figure 1:
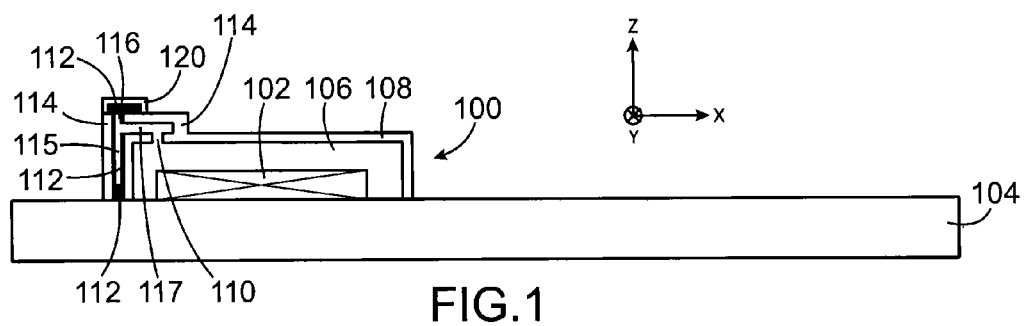
FIG. 1 represents a structure for encapsulating an electronic device according to a first embodiment.

FIG. 1 is first referred to, which represents a structure 100 for encapsulating an electronic device 102, here corresponding to a micro-bolometer, according to a first embodiment.

The device 102 is made on a support 104 here corresponding to a silicon substrate, and is encapsulated in a first cavity 106 formed between the support 104 and a cap 108, for example made as a thin layer by a TLP type method and comprising a material, such as amorphous silicon or $SiO_2$. The cap 108 may comprise any material, for example a dielectric, semi-conductor or even electrically conductive one.

The cap 108 includes one or more apertures 110 (a single aperture 110 is represented in FIG. 1) formed through the cap 108. A portion of material 114, for example comprising the same material as the one forming the cap 108, and made on and near the cap 108, forms a second cavity 115 adjacent to the first cavity 106 and communicating with the same via a channel 117 and the aperture 110. Both cavities 106 and 115 are made on the support 104 one next to the other. At least one outer side wall of the first cavity 106 corresponds to at least one of the inner side walls of the second cavity 115 as shown on FIG. 1.

A portion of getter material 112, for example comprising titanium or any other material, such as a metal or a metal alloy, capable of performing a gas absorption and/or adsorption, is deposited into the second cavity 115. The portion of getter material 112 is deposited onto the support 104, at the bottom of the second cavity 115 as well as against the side walls of the second cavity 115 (and thus against at least one outer side wall of the first cavity 106 because here, one portion of material forms one of the outer side walls of the first cavity 106 and also one of the inner side walls of the second cavity 115). Part of the portion of getter material 112 also lies on part of the portion of material 114, thus closing an aperture 116 made through the portion of material 114. This part of the portion of getter material 112 is covered with a sealing layer 120 preventing external gases from contacting the portion of getter material 112. The sealing layer 120 here hermetically seals the volume, or space, formed by the second cavity 115 and the first cavity 106. After the getter material 112 has been heat activated, it then absorbs and/or adsorbs only gases lying in this closed volume, or space.

Although a single aperture 110 is represented in FIG. 1, it is possible that several apertures, for example similar to the aperture 110 represented in FIG. 1, be made through the cap 108 and communicate the inner volume of the first cavity 106 with some getter material deposited outside the first cavity 106, in one or more second cavities for example similar to the second cavity 115, through these apertures 110.

FIGS. 2A to 2G are now referred to, representing the steps of making an encapsulating structure 200 according to the second embodiment.

In this second embodiment, the structure 200 makes an individual encapsulation of several electronic devices 202 made on the support 104 and distributed on the support 104 as an array. When the electronic devices 202 are optical sensors such as micro-bolometers, each electronic device 202 can correspond to one pixel of the array of micro-bolometers thus obtained.

The support 104 and electronic devices 202 are first covered with a sacrificial layer for example comprising a resin and shaped through photolithography and etching for each device 202 to be covered with a portion 204 of sacrificial material defining the future volume of a first cavity 206 wherein the device 202 is intended to be encapsulated.

A conformal deposition is made of a layer comprising for example a dielectric material such as amorphous silicon, for forming caps 208 encapsulating the devices 202. This deposition is called a conformal deposition because it covers, with a substantially constant thickness, all the exposed surfaces of the portions 204 of sacrificial material, that is the upper faces and side walls of these portions 204, thereby forming the caps 208 which are intended for bounding, with the support 104, the first cavities 206 wherein the devices 202 will be encapsulated. This material is also deposited between the portions 204, onto the support 104. The deposited layer forming the caps 208 has preferably a thickness between about 1 µm and a few micrometers, for example 10 µm. Each cap 208 is spaced apart from its neighboring caps by free spaces 209 for example having a width between about 1 and 2 µm, intended for forming the second cavities wherein some getter material will be deposited.

Figure 2A:
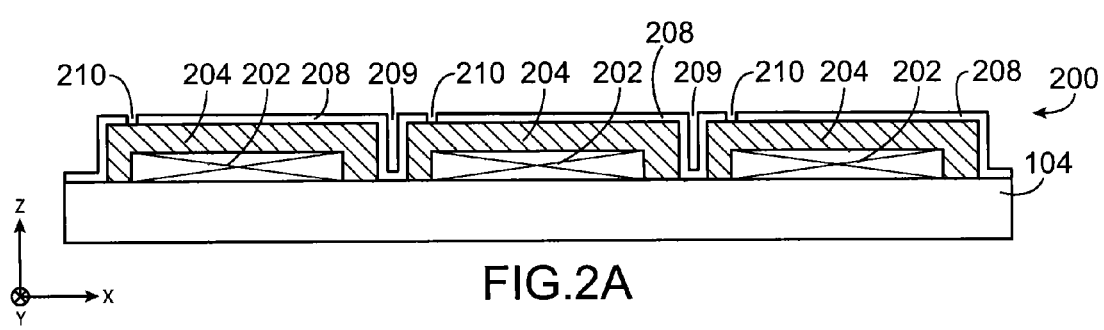
FIGS. 2A to 2G represent the steps of a method for making a structure for encapsulating several electronic devices according to a second embodiment.

Apertures 210 are then made through the caps 208, forming accesses to the portions 204 of sacrificial material, that is release holes (FIG. 2A).

Figure 2B:
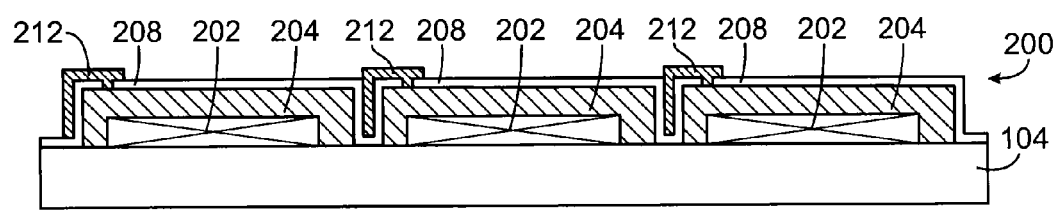
Figure 2C:
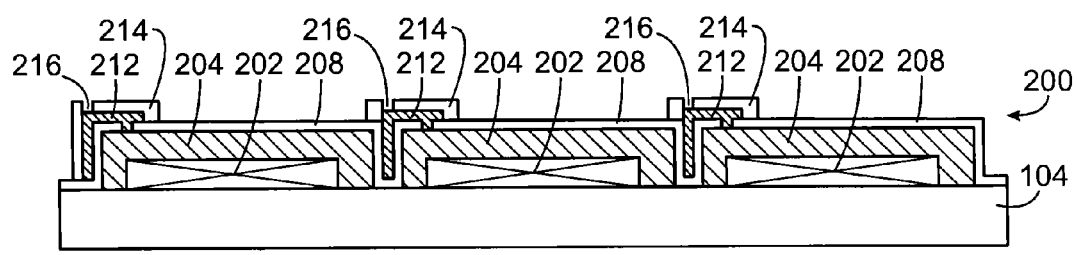
Figure 2D:
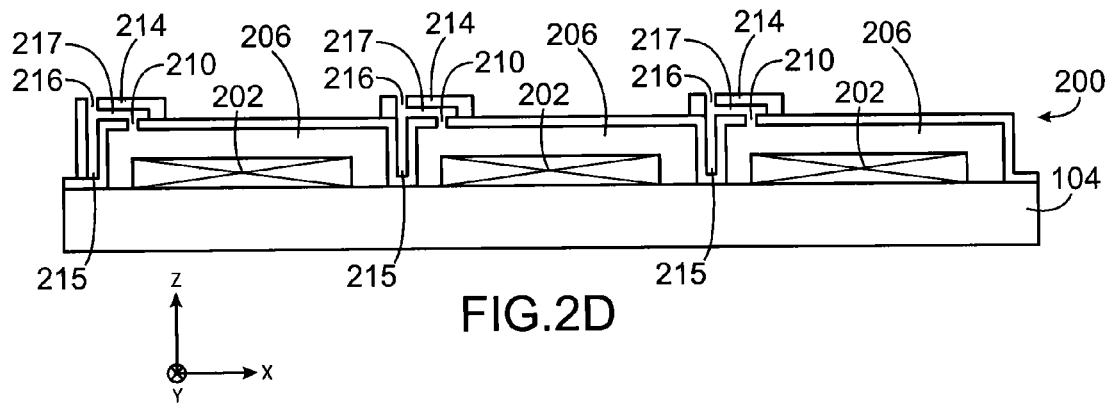
Figure 2F:
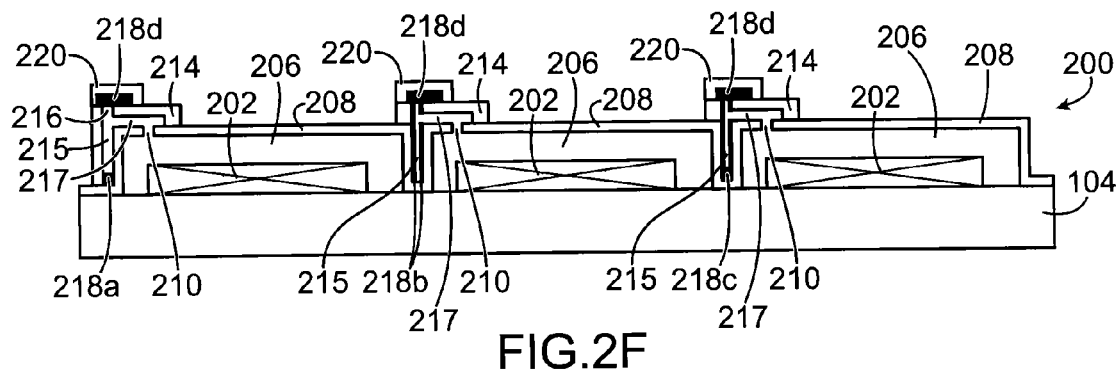
Figure 2G:
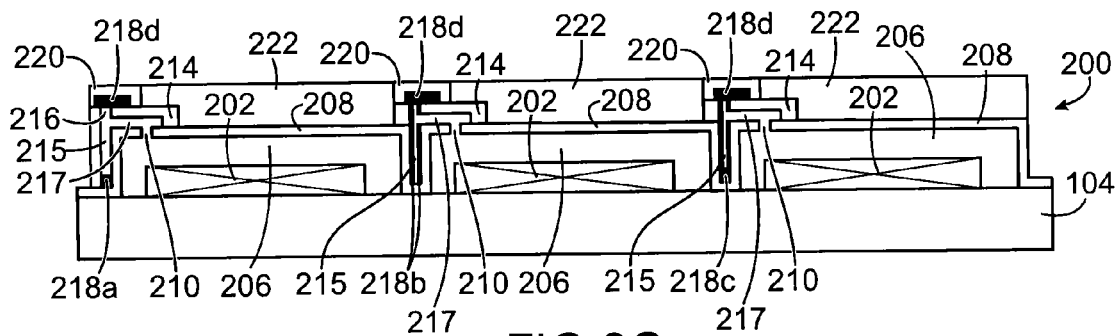
Figure 2E:
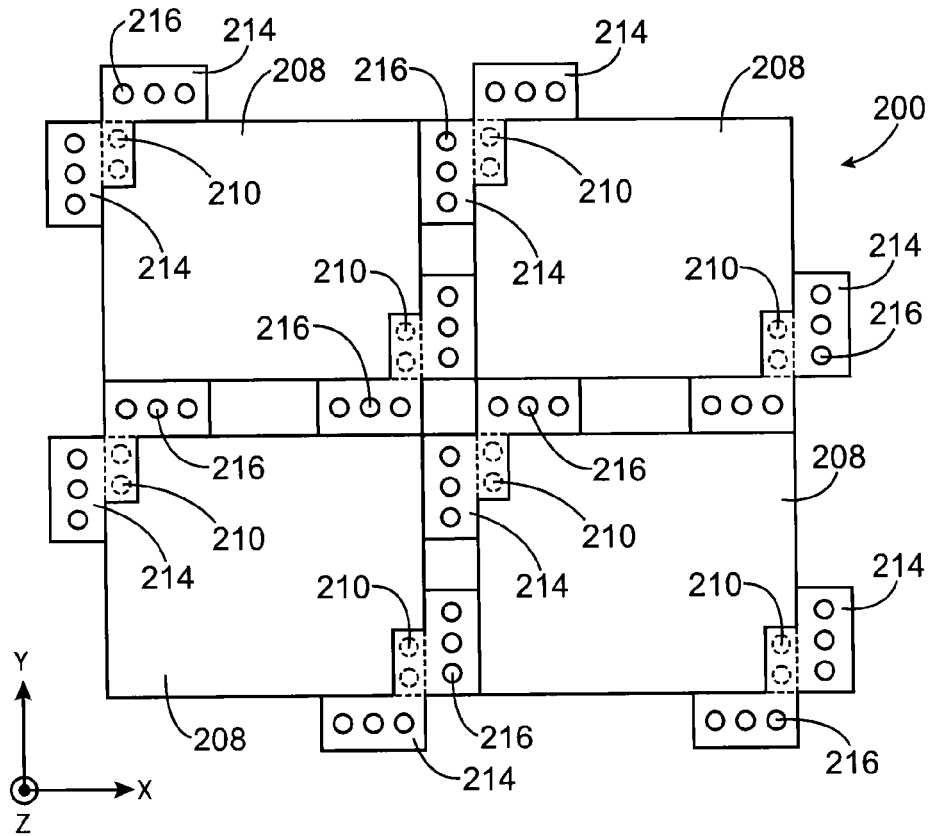

As is visible in the example of FIG. 2E, four apertures 210 formed at two upper edges of the cap 208 pass through each cap 208.

As represented in FIG. 2B, a second layer of sacrificial material, for example, of a nature similar to that used for making the portions 204, is deposited onto all previously made elements, thereby covering the caps 208. The sacrificial material of this second layer is in particular deposited into the apertures 210 as well as into the free spaces 209 in between the caps 208. The second layer of sacrificial material is then subjected to photolithography and etching steps, forming second portions of sacrificial material 212. Each of these second portions of sacrificial material 212 fills one of the free spaces 209 intended for forming the second cavities wherein some getter material is intended to be deposited. Furthermore, each of the second portions of sacrificial material 212 also fills a volume (above the caps 208 in the example of FIG. 2C) intended for forming a channel, or "baffle", which will enable the inside of one of the first cavities to communicate with the portion of getter material which will be deposited into part of the free space 209 filled by the second portion of sacrificial material 212, that is one of the first cavities 206 to communicate with one of the second cavities. One or more apertures 210 (intended for opening into this channel) are also filled with the sacrificial material of the second portion 212.

A layer of material, for example similar to that used for making the caps 208, is deposited by covering in particular the second portions of sacrificial material 212. This layer may possibly be etched in order to retain only portions 204 covering the second portions of sacrificial material 212.

Second apertures 216 are made through these portions 214, facing parts of the second portions of sacrificial material 212 filling parts of the free spaces 209 between the caps 208 (FIG. 2C). The second apertures 216 will be used as release holes to remove the second portions of sacrificial material 212 as well as the sacrificial portions 204 through the channels 217 obtained by etching the second portions of sacrificial material 212 and through the apertures 210.

The getter material will then be deposited through these second apertures 216, into the second cavities 215 bounded by the material 214. As is visible in the example of FIG. 2E, each cap 208 is partly covered by two portions of material 214, and each of both portions of material 214 covers two apertures 210 formed through the cap 208, six second apertures 216 being made through each of these portions of material 214.

The second portions of sacrificial material 212 are removed for example by plasma etching through the second apertures 216, thus releasing parts of the spaces 209 between the caps 208 (or between the first cavities 206) intended for receiving some getter material, that is forming the second cavities 215. Spaces released between the portions 214 and the caps 208 also form channels 217 which will be used to communicate the getter material provided in the second cavities 215 with the inside of the first cavities 206.

This plasma etching also removes the portions of sacrificial material 204, thereby releasing the devices 202 and forming the first cavities 206, between the caps 208 and the support 104, wherein the devices 202 are encapsulated (FIG. 2D). The second apertures 216 are facing parts of the second cavities 215 between the different caps 208 intended for receiving the getter material. The channels 217 communicate, at each cap 208, the apertures 210 and 216 even though the same are not aligned when above the other in the plane of the support 104 (plane parallel to the plane (X,Y) represented in FIG. 2D). The first cavities 206 and the second cavities 215 are arranged on the support 104 one next to the other.

FIG. 2E represents a top view of the assembly made. In this figure, it can be seen that four apertures 210 formed at two upper edges of the cap 208 and which are coupled to twelve second apertures 216 through the channels 217 pass through each cap 208. It can also be seen that two inner side walls of each of the second cavities 215 correspond to outer side walls of two first cavities 206 adjacent to the second cavity 215.

As represented in FIG. 2F, a deposition of getter material 218 is then made in the second cavities 215 bounded by the portions 214, through the apertures 216. Because the apertures 210 passing through the caps 208 are projected with respect to the second apertures 216, the getter material 218 is not deposited into the first cavities 206. The getter material may be either deposited at the bottom of the second cavities 215, on the portions of material forming the caps 208 and deposited onto the support 104, between the caps 208 (as is the case for the portion 218$a$), or against the side flanks, or side walls, of the caps 208 (case of the portions 218$b$), or even both (case of the portions 218$c$). It is also possible that some getter material fills all the second cavities 215 bounded by the portions of material 214.

The configuration wherein the getter material will be deposited will be a function of the dimensions of the second apertures 216 in the plane of the support 104 (parallel to the plane (X,Y)) with respect to those of the second cavities 215 in this same plane which are bounded by the caps 208 and the portions of material 214, as well as a function of the position of these second apertures 216 with respect to the second cavities 215. For example, if the dimensions of the second apertures 216 are substantially similar to those of the second cavities 215 (for example in the case of edges of the apertures 216 which are tangent to the side flanks of the caps 208), the getter material can be deposited against the side flanks of the caps 208 and possibly at the bottom of the second cavities 215. If the apertures 216 have lower dimensions, the getter material can only be deposited at the bottom of the second cavities 215, on the substrate 104. Upon depositing the getter material, portions 218$d$ of getter material are also formed above the portions 214 and plug the second apertures 216.

These portions 218$d$ of getter material may then be covered with a sealing layer 220. When the devices 202 are optical devices intended for emitting and/or receiving light, the previously deposited getter material and the sealing layer 220 may be photolithographed and etched for the optical field of the devices 202 not to be obstructed by the getter material or the sealing layer 220. Finally, the entirety is covered with an antireflective layer 222, for example comprising multiple layers comprising germanium and zinc sulphide layers (FIG. 2G).

The encapsulating structure 200 thus made forms an array structure of micro-electronic devices 202 encapsulated in first hermetic cavities 206, the inner spaces of which communicate with side spaces between the cavities forming the second cavities 215 wherein portions of getter material 218 are provided, performing a gas absorption and/or adsorption in the first cavities 206.

The above described configuration of the apertures 210 and 216 is an exemplary embodiment.

Generally, one or several apertures 210 communicating the inside of the first cavity 206 with an adjacent second cavity wherein a getter material is disposed may pass through each cap 208. The apertures 216 and 210 may have circular, oblong shaped cross-sections, in a plane parallel to that of the support 104, or be made as slots or any other shape.

Furthermore, for each first cavity 206, several apertures 210 or 216 may be made next to one another, thus forming aligned apertures surrounding at least partly the first cavity 206. The number and dimensions of the apertures 210 and 216 associated with each first cavity 206 will fit, depending on the available space, the desired absorption and/or adsorption capacity of the getter material, etc.

Figure 3A:
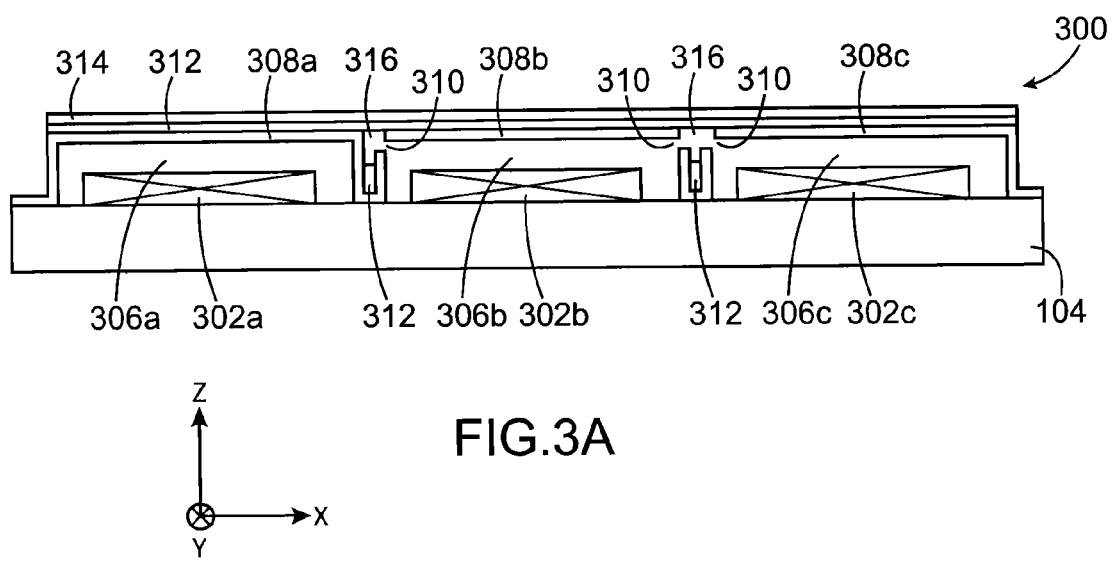
FIGS. 3A and 3B represent a structure for encapsulating several electronic devices according to a third embodiment.
Figure 3B:
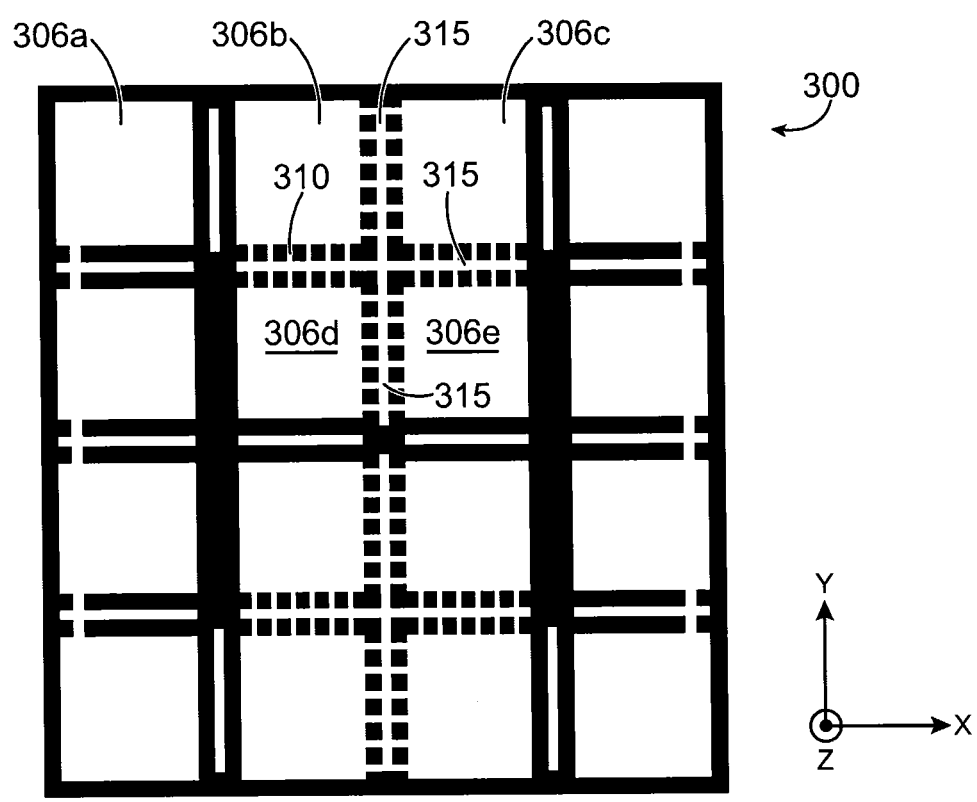

FIGS. 3A and 3B represent an encapsulating structure 300 according to a third embodiment.

In this third embodiment, the encapsulating structure 300 includes several electronic devices 302 (devices 302$a$, 302$b$, 302$c$ represented in FIG. 3A), for example similar to the previously described devices 102 and 202, each encapsulated in a first cavity 306 formed between the substrate 104 and a cap 308. As in the preceding embodiments, apertures 310 communicating the inside of the first cavities 306 with a getter material 312 provided in spaces formed between several cavities 306 and corresponding to second cavities 315 pass through the caps 308.

The apertures 310 here are made through the upper edges of the caps 308, that is for each aperture 310, at a junction between an upper wall of the cap 308 and one of the side walls of the cap 308 such that, when the getter material 312 is deposited, very little or no getter material is left inside the first cavities 306. A minor part of getter material 312 can be deposited against the side walls of the cap, inside the first cavities 306.

A layer of getter material 312 also covers the caps 308, thus plugging second apertures 316 communicating the inside of several adjacent first cavities 306 via the apertures 310. The layer of getter material is covered with a sealing layer 314 for example having a nature similar to the sealing layer 220.

Unlike the other embodiments, the apertures 310 communicate the inside of several first cavities 306 between them. In the example of FIGS. 3A and 3B, it can be seen that the apertures 310 formed through the side walls of the caps 308 of the cavities 306b, 306c, 306d and 306e communicate the insides of all these four cavities between them as well as with the second cavities 315 formed between the outer side walls of the first cavities wherein some getter material 312 is provided (not represented in FIG. 3B). The encapsulating structure 300 thus forms a set of sub-arrays (in the example of FIGS. 3A and 3B, each sub-array is formed by a square of 2×2 devices 302 encapsulated in first cavities 306, all the four of which communicate between each other).

The apertures 310 are made at upper edges of the caps 308 such that, when the getter material 312 is deposited, very little or no getter material is left inside the first cavities 306. The deposition of getter material 312 in the first cavities 306 is avoided because, at the apertures 310, the upper walls of the caps 308 are not recessed, in the plane (X,Y), from the inside of side walls of these caps 308. In other words, the apertures 310 are formed through surfaces of the caps 308 which are perpendicular to the main plane of the support 104 (plane parallel to the plane (X,Y)), this main plane corresponding to the face of the support 104 wherein the micro-electronic devices 302 are made. Thus, with such apertures 310, first adjacent cavities communicate and the deposition of getter material 312 is made between the first cavities 306, in the second cavities 315 by avoiding depositing some getter material in the first cavities 306 without using apertures including baffles (or channels) as previously described for the encapsulating structures 100 and 200.

The first cavities 306 and the second cavities 315 are arranged on the support 104 one next to the other. Moreover, the inner side walls of each of the second cavities 315 correspond to outer side walls of the first cavities 306 adjacent to the second cavity 315.

Alternatively, it is possible that the encapsulating structure 300 includes cavities 306 through which pass apertures similar to the previously described apertures 210, that is including channels.

When such apertures and channels are made facing each other, it is possible also to have a communication between adjacent first cavities via these apertures and channels.

The invention claimed is:

1. A structure for encapsulating at least one electronic device, including at least one first cavity bounded by a support and at least one cap provided on the support and wherein the electronic device is encapsulated, at least one aperture passing through the cap and communicating the inside of the first cavity with at least one portion of getter material provided in at least one second cavity which is arranged on the support and adjacent to the first cavity, at least one part of said portion of getter material being provided on the support or against at least one outer side wall of the first cavity, the first cavity and the second cavity forming together a hermetically sealed volume.

2. The encapsulating structure according to claim 1, wherein the volume formed by the first cavity and the second cavity is hermetically sealed by the portion of getter material.

3. The encapsulating structure according to claim 1, wherein the aperture passes through a surface of the cap which is substantially perpendicular to a main plane of the support.

4. The encapsulating structure according to claim 1, wherein the inside of the first cavity communicates with the portion of getter material via at least one channel forming space between the first cavity and the second cavity, the aperture being such that it opens into the channel.

5. The encapsulating structure according to claim 1, wherein at least one second part of the portion of getter material plugs at least one second aperture giving access to the channel or to the first aperture.

6. The encapsulating structure according to claim 5, wherein the second part of the portion of getter material is covered with a sealing layer.

7. The encapsulating structure according to claim 1, including a plurality of electronic devices encapsulated in first distinct cavities bounded by the support and caps provided on the support, apertures passing through the caps and communicating the inside of the first cavities with one or more portions of getter material provided in one or more second cavities formed between the first cavities, at least one part of said portion(s) of getter material being provided on the support or against one or more outer side walls of the first cavities.

8. The encapsulating structure according to claim 7, wherein the insides of several first cavities communicate together via the apertures passing through the caps of said fist cavities.

9. The encapsulating structure according to claim 7, further including a layer of getter material hermetically sealing the volume(s) formed by the first cavities and the second cavity or cavities.

* * * * *